United States Patent
Müller et al.

(10) Patent No.: US 10,331,213 B2
(45) Date of Patent: Jun. 25, 2019

(54) OPERATOR CONTROL DEVICE AND METHOD FOR ACTUATING FUNCTIONAL UNITS AND MOTOR VEHICLE

(71) Applicant: AUDI AG, Ingolstadt (DE)

(72) Inventors: Ulrich Müller, Ingolstadt (DE); Manuel Kühner, Markgröningen (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/575,702

(22) PCT Filed: May 19, 2016

(86) PCT No.: PCT/EP2016/061282
§ 371 (c)(1),
(2) Date: Nov. 20, 2017

(87) PCT Pub. No.: WO2016/184968
PCT Pub. Date: Nov. 24, 2016

(65) Prior Publication Data
US 2018/0292904 A1    Oct. 11, 2018

(30) Foreign Application Priority Data

May 21, 2015 (DE) .......................... 10 2015 006 605

(51) Int. Cl.
*G06F 3/041* (2006.01)
*G06F 3/01* (2006.01)
(Continued)

(52) U.S. Cl.
CPC .............. *G06F 3/016* (2013.01); *B60K 37/06* (2013.01); *G06F 3/03547* (2013.01);
(Continued)

(58) Field of Classification Search
CPC ......... G06F 3/041; G06F 3/045; G01R 27/26; G06K 11/06; G08C 21/00
See application file for complete search history.

(56) References Cited

U.S. PATENT DOCUMENTS 6,219,034 B1   4/2001  Elbing et al.
9,785,237 B2 * 10/2017  Shinozaki ............... G06F 3/016
(Continued)

FOREIGN PATENT DOCUMENTS

DE   10 2008 036 155 A1   2/2010
DE   11 2013 002 410 T5    1/2015
(Continued)

OTHER PUBLICATIONS

English Language Translation of the International Preliminary Report on Patentability by WIPO dated Nov. 23, 2017 in corresponding International Patent Application No. PCT/EP2016/061282.
(Continued)

*Primary Examiner* — Pegeman Karimi
(74) *Attorney, Agent, or Firm* — Staas & Halsey LLP

(57) ABSTRACT

A touch-sensitive surface is provided on an operator control device that includes a way to detect a force applied by a user to at least one area of the touch-sensitive surface. An actuator generates haptic feedback to the user when the force applied exceeds a threshold value. An evaluation unit of the operator control device determines a time-related gradient of the force and changes the threshold value of the force according to the time-related gradient.

15 Claims, 2 Drawing Sheets

(51) Int. Cl.
   *B60K 37/06* (2006.01)
   *G06F 3/0354* (2013.01)
(52) U.S. Cl.
   CPC ...... *G06F 3/041* (2013.01); *B60K 2350/1028* (2013.01); *G06F 2203/04105* (2013.01); *H03K 2217/96062* (2013.01)

(56) References Cited

U.S. PATENT DOCUMENTS

| | | | | |
|---|---|---|---|---|
| 2006/0170660 | A1* | 8/2006 | Miyata | G06F 3/03547 345/173 |
| 2006/0192771 | A1* | 8/2006 | Rosenberg | A63F 13/06 345/173 |
| 2012/0249314 | A1* | 10/2012 | Kuwabara | G06F 3/041 340/407.2 |
| 2013/0050112 | A1* | 2/2013 | Vanhelle | B60K 37/06 345/173 |
| 2013/0082973 | A1* | 4/2013 | Wurzel | G06F 3/044 345/174 |
| 2014/0267065 | A1 | 9/2014 | Levesque | |
| 2015/0058723 | A1 | 2/2015 | Cieplinski et al. | |

FOREIGN PATENT DOCUMENTS

| | | |
|---|---|---|
| DE | 11 2013 002 409 T5 | 2/2015 |
| DE | 102015006605.6 | 5/2015 |
| EP | 2 515 209 A1 | 10/2012 |
| WO | PCT/EP2016/061282 | 5/2016 |

OTHER PUBLICATIONS

International Search Report for PCT/EP2016/061282 dated Jul. 29, 2016.

German OA for Application No. 102015006605.6 dated May 11, 2016.

* cited by examiner

OPERATOR CONTROL DEVICE AND METHOD FOR ACTUATING FUNCTIONAL UNITS AND MOTOR VEHICLE

CROSS REFERENCE TO RELATED APPLICATIONS

This application is the U.S. national stage of International Application No. PCT/EP2016/061282, filed May 19, 2016 and claims the benefit thereof. The International Application claims the benefit of German Application No. 10 2015 006 605.6 filed on May 21, 2015, both applications are incorporated by reference herein in their entirety.

BACKGROUND

Described below is an operator control device for actuating functional units of a motor vehicle. The operator control device has a touch-sensitive surface and a sensor for detecting a force which can be applied by a user to at least one area of the touch-sensitive surface. An actuator of the operator control device serves for generating a haptic feedback to the user according to the exceeding of a threshold value of the force. Also described below are a motor vehicle and to a method for actuating functional units of a motor vehicle using such an operator control device.

Touch input devices that are provided with haptic feedback are increasingly being used in motor vehicles. This feedback is an artificially generated, that is to say actoric, active haptic feedback. It is in this way made clear to an operator who operates the touch input device that an operator control action as such has been detected, by the actuator bringing about a haptically perceptible movement of the surface that is touched. Furthermore, such touch input devices sometimes include force detection. Therefore, the triggering of functions is not only made dependent on the touching of the touch input device. Rather, the triggering of a desired function also depends on the force applied by the user, in the same way as a user is accustomed to from a mechanical button. For example, the current C class of the automobile manufacturer Mercedes-Benz has a touchpad that is provided with force detection and in which a haptic feedback is artificially generated.

Furthermore, DE 10 2008 036 155 A1 discloses an operator control button arrangement for a motor vehicle with an operator control button. The operator control button has a surface and a pressure sensor. An actuator serves for generating a haptic reaction when the operator control button is actuated. The generation of the haptic reaction by the actuator is made dependent here on whether an operating force reaches a threshold value.

DE 11 2013 002 410 T5 describes a haptic device such as a tablet computer or a smartphone. Here, too, a haptic feedback to a user can take place by a surface moving, vibrating or oscillating. Here, a feedback force may be correlated with a rate at which a compressive force is applied by the user to the surface of the haptic device.

DE 11 2013 002 409 T5 describes an electronic device with a touch-sensitive surface for the display of additional information as a reaction to user contact. When there is contact of a certain intensity, the additional information is displayed, without waiting a predefined delay time. When there is contact of an intensity below a certain intensity threshold, however, waiting initially occurs for the predefined delay time before the additional information is displayed. The device may have tactile output generators, which are coupled with a haptic feedback control unit.

In the case of the operator control devices known from the related art for actuating functional units of a motor vehicle, the haptic feedback is triggered when a threshold value of the force applied by the user is exceeded. In order to keep costs within acceptable limits and also because of technical boundary conditions, there is however always a certain time delay here between the exceeding of the threshold value of the force and the actual triggering of the haptic feedback. This has the consequence that the actual haptic feedback is triggered at a later time, and consequently only when the force is higher than the force threshold. As far as the user is concerned, this gives the impression of an increased triggering force that has to be applied to obtain the haptic feedback. Moreover, this higher triggering force also depends on the actuating speed, or to be more precise on the progression over time of the increase in the force.

This is accompanied by significant disadvantages. On the one hand, the perceived or effective triggering force may be considerably different from the desired threshold value of the force. Furthermore, the perceived or effective triggering force is not constant, but variable, and it is dependent on the type of actuation, that is to say the actuation characteristics.

SUMMARY

Described below is an improved operator control device of the type mentioned at the beginning, a motor vehicle with such an operator control device and also an improved method for actuating functional units of a motor vehicle.

In the operator control device, an evaluation unit determines a time-related gradient of the force that the user applies to the at least one area of the touch-sensitive surface. The evaluation unit is also designed to change the threshold value of the force according to the gradient determined. This is based on the realization that the increase in force, that is to say the gradient of the force applied by the user, together with the system-related delay time have an influence on the effective force threshold that causes the actuator to generate the haptic feedback when it is exceeded.

By determining or detecting the gradient of the force, it is however possible with the operator control device to adapt or change the threshold value of the force. In this way it can be achieved that the triggering force that is felt always remains the same, virtually independently of the speed with which the user applies the force when operating the operator control device by touching the at least one area of the touch-sensitive surface. It can therefore be prevented that the operation of the operator control device feels sluggish or slow.

Thus, for example, it can be ensured that, both when a comparatively great pressure is rapidly applied by the user to the at least one area of the touch-sensitive surface on the one hand and when there is a slow increase in the force or the gradient of the force on the other hand, the haptic feedback is perceived with in each case approximately the same value of the applied force. This not only increases the operating comfort when actuating the functional units of the motor vehicle. Rather, such reliable and, in terms of the actuating characteristics, consistent operation of the functional units of the motor vehicle, which is at least less dependent on the actuating speed or the force gradient, is also conducive to driving safety. This is so because the driver who is operating the operator control device to actuate a functional unit, such as for instance an air-conditioning system, a navigation system, an infotainment system or the like, is not confused by triggering forces of the haptic feedback that are felt or perceived to be of different levels, that is to say by varying felt force thresholds.

The evaluation unit may reduce the threshold value of the force according to the gradient determined. This is so because the system-related delay time usually has the effect that the perceived triggering force, that is to say the value of the force at which the user actually perceives the haptic feedback, is shifted to a greater value as long as there is no change in the threshold value of the force that causes the actuator to be actuated to generate the haptic feedback when it is exceeded.

Therefore, reducing the threshold value of the force according to the gradient determined is particularly suitable for imparting to the user a consistent felt triggering force.

It has also been found to be advantageous if the evaluation unit is designed to reduce the threshold value of the force to approximately 70% to 90% of an initial value of the force if a value of the gradient is greater than a predetermined value. This is based on the realization that, when there is a very slow increase in force, that is to say when there is a particularly small value of the gradient, there will scarcely be any increase in the perceived force threshold even when there is a certain delay time between the exceeding of the threshold value of the force and the actual generation of the haptic feedback by the actuator. This is so because, when there is a small value of the gradient, the force threshold only increases insignificantly within the delay time. This is the case for example if the gradient of the force is less than 0.5 N per 10 milliseconds, in particular less than 0.2 N per 10 milliseconds.

By contrast, if the force per unit of time changes very rapidly, that is to say the value of the gradient is greater than a predetermined value, the same delay time already leads to a marked increase in the perceived force threshold, that is to say the value of the force at which the user actually perceives the haptic feedback. This can however be compensated by reducing the threshold value of the force to for example 80% of the initial value of the force.

For example, the initial value of the force may be at 5 N. Accordingly, the actuator generates the haptic feedback when the force applied by the user exceeds 5 N. If, however, the system-related delay time is in the range of for example 10 milliseconds and the gradient is for example 1 N per 10 milliseconds, maintaining the threshold value of the force at 5 N would lead to the user only perceiving the haptic feedback when a force of 6 N is achieved. If, however, the threshold value of the force is reduced to 80 percent of the initial value of 5 N, that is to say to a value of 4 N, the user perceives the haptic feedback as soon as he actually applies the force of 5 N to the touch-sensitive surface.

It has also been found to be advantageous if the evaluation unit is designed to take into account when changing the threshold value of the force the length of a time period by which the generation of the haptic feedback is delayed with respect to the exceeding of the threshold value of the force. This is because this system-related delay time is of relevance for when the user perceives the haptic feedback generated. If, therefore, the length of this time period is known, it can be taken into account when changing the threshold value of the force in such a way that the triggering force felt by the user is largely independent of the gradient of the force.

In particular, the evaluation unit may be designed to change, in particular reduce, the threshold value of the force all the more the greater the length of the time period. Thus, delay times of different magnitudes can be taken into account particularly well in a system-related manner.

It is also of advantage if the operator control device is able to determine the length of the time period. This is because it is then possible to take into account the fact that this delay time is not necessarily constant. This is because it is rather the case that the length of the time period may be variable over the lifetime of the operator control device and/or according to external influencing factors, such as for example the temperature. Such changes can be taken into account particularly well if the operator control device is able to determine the length of the time period.

The operator control device may be designed in particular as a touchpad or as a touchscreen. This is because such operator control devices are particularly favorable in a motor vehicle for actuating the functional units.

The operator control device may however also be an operator control button (or it may at least include an operator control button), in which the actuator is responsible for generating the haptic feedback.

In the case of the method for actuating functional units of a motor vehicle, a force that is applied by a user to at least one area of a touch-sensitive surface of an operator control device is detected. A haptic feedback to the user is generated by an actuator according to the exceeding of a threshold value of the force. Furthermore, the at least one functional unit is actuated according to the exceeding of the threshold value of the force. Here, a time-related gradient of the force is determined by an evaluation unit of the operator control device. The threshold value of the force is changed according to the gradient determined.

The advantages and preferred embodiments described for the operator control device also apply to the motor vehicle and to the method.

The features and combinations of features cited in the description above and the features and combinations of features cited in the description of the figures below and/or shown in the figures on their own can be used not only in the respectively indicated combination but also in other combinations or on their own without departing from the scope of the invention. Therefore, embodiments which are not explicitly shown in the figures or explained but are apparent to one of ordinary skill in the art and can be produced by separated combinations of features from the embodiments explained are also considered to be covered and disclosed.

BRIEF DESCRIPTION OF THE DRAWINGS

These and other aspects, advantages, features and details will become more apparent and more readily appreciated from the following description of exemplary embodiments, taken in conjunction with the accompanying drawings of which.

DETAILED DESCRIPTION OF THE PREFERRED EMBODIMENT

Figure 1:
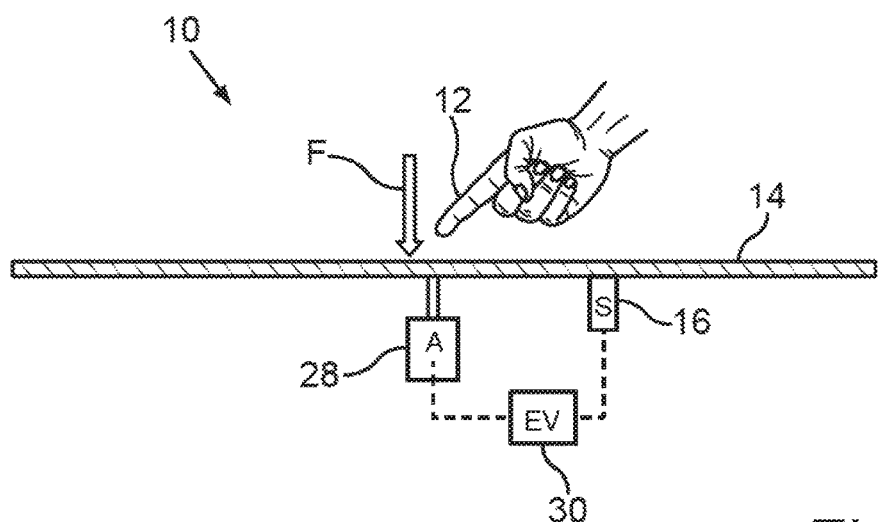
FIG. 1 is a greatly schematized side view of an operator control device of a motor vehicle in which an actuator generates a haptic feedback if a force applied by a user exceeds a threshold value.

Reference will now be made in detail to the preferred embodiments, examples of which are illustrated in the accompanying drawings, wherein like reference numerals refer to like elements throughout.

FIG. 1 schematically shows an operator control device 10, which is designed for example as a touchpad or touchscreen and serves for actuating functional units of a motor vehicle. If a user for example uses a finger 12 to apply a force F to a touch-sensitive surface 14 of the operator control device 10, the force F is detected, in particular by a sensor 16 or a number of sensors 16. The sensors 16, which are designed for example as capacitive, optical or inductive sensors or as strain gages, generally detect here a change in displacement or a deformation of an elastic component, and therefore only measure the force F indirectly. Instead of the sensor 16 or in addition to it, other ways of detecting the force F may also be provided.

Figure 2:
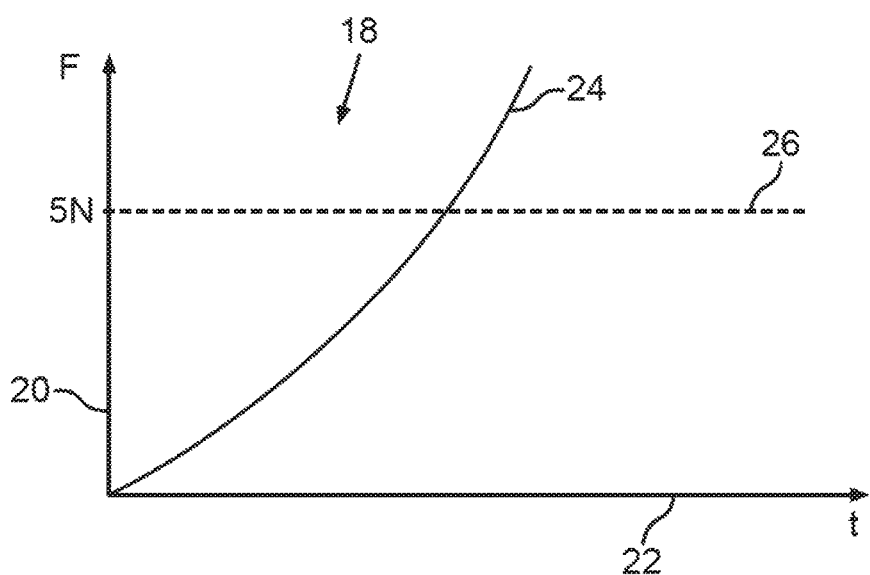
FIG. 2 is a graph of the variation of the force over time and the threshold value of the force that causes the actuator to be actuated when it is exceeded.

In a graph 18 shown in FIG. 2, the force F is plotted on the y axis 20 and the time t is plotted on the x axis 22. A curve 24 illustrates the variation of the force F over time t. Also indicated in the graph 18 is a threshold value 26 of the force F. When this threshold value 26 is exceeded, an actuator 28 is actuated (compare FIG. 1), which generates a haptic feedback.

For example, the actuator 28 may bring about a vibration of the touch-sensitive surface 14 or a lateral movement of the same. This on the one hand informs the user that the application of the force F has been interpreted as a desired operating action by the user, that is to say as actuation of the operator control device 10. Moreover, in response, the functional unit desired by the user is actuated, for instance in that a function of an air-conditioning system of the motor vehicle is switched on, or a navigation system, an infotainment system or the like.

The actuation of the actuator 28 according to the force F detected by the sensor 16 takes place in the present case by way of an evaluation unit 30, which may for example be designed as a control unit. In the present case, however, the evaluation unit 30 is designed to change the threshold value 26 of the force F. For this, the evaluation unit 30 determines a time t-related gradient 32 of the force F applied by the user when touching the operator control device 10, as will be explained with reference to FIG. 3 and FIG. 4.

Figure 3:
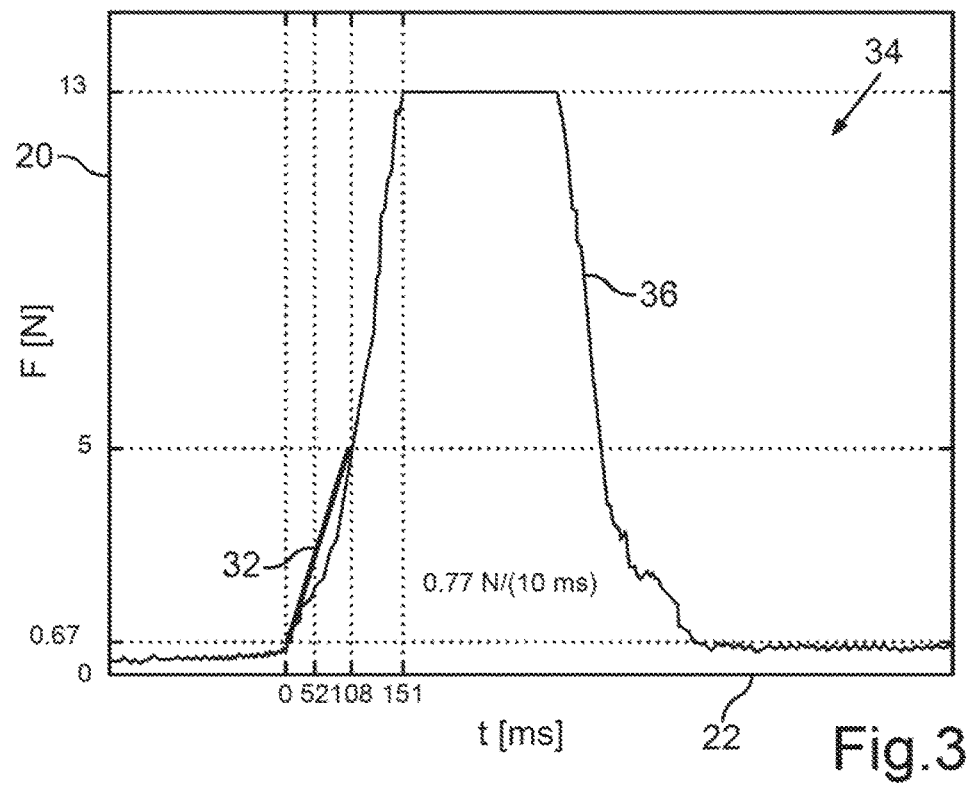
FIG. 3 is an exemplary variation of force over time when actuating an actoric input device in which a haptic feedback is triggered.

FIG. 3 shows in a further graph 34 with the y axis 20 and the x axis 22 on the basis of a curve 36 an exemplary variation of force over time when actuating the operator control device 10. Here, a haptic feedback takes place, triggered by the actuator 28 when there is a force F of 5 N. Realistic values for the threshold value 26 may lie between 1 N and 7 N, values of around 3.5 N being perceived in particular as pleasant in terms of operating comfort. In a time window of 0 milliseconds to 108 milliseconds, the curve 36 of the gradient 32, that is to say the increase in the force per unit of time, shown in FIG. 3 is approximately 0.77 N per 10 milliseconds.

There is usually a certain delay time, that is to say delay of time, between the exceeding of the threshold value 26 of the force F and the triggering of the haptic feedback by the actuator 28. Such a delay time, which may also be referred to as a delay or latency, may be for example from 10 milliseconds to 20 milliseconds. With respect to the exemplary gradient 32 in FIG. 3, however, a delay of 20 milliseconds leads to an increase in the perceived force threshold of approximately 1.5 N. The haptic feedback is therefore not generated as desired directly as soon as the force F applied by the user exceeds the threshold value 26, but because of the delay time only when the user actually applies a force F of approximately 6.5 N. As far as the user is concerned, this can be clearly felt, and has the effect that the system, that is to say the operator control device 10, feels slow or sluggish.

The influence of the delay time on the force threshold actually perceived by the user, that is to say the value of the force F at which the haptic feedback generated by the actuator 28 can be detected by the user with the sense of touch, is to be explained once again below on the basis of FIG. 4. In a further graph 38, shown in FIG. 4, the force F is in turn plotted on the y axis 20 in N and the time t is plotted on the x axis 22. A first line 40 illustrates a comparatively rapid increase in force $F_1(t)$. Let us assume a certain delay time, that is to say a time period $\Delta t$, of for example 10 milliseconds by which the generation of the haptic feedback is delayed with respect to the exceeding of the threshold value 26 of the force F. Accordingly, the line 40 therefore gives a gradient $\Delta F_1/\Delta t$, which in the present case corresponds to a certain slope of the line 40. The gradient of the line 40 therefore has the effect that the user only feels the haptic feedback triggered by the actuator 28 when the value of the force F that is indicated in FIG. 4 by an auxiliary line 42 is reached.

Figure 4:
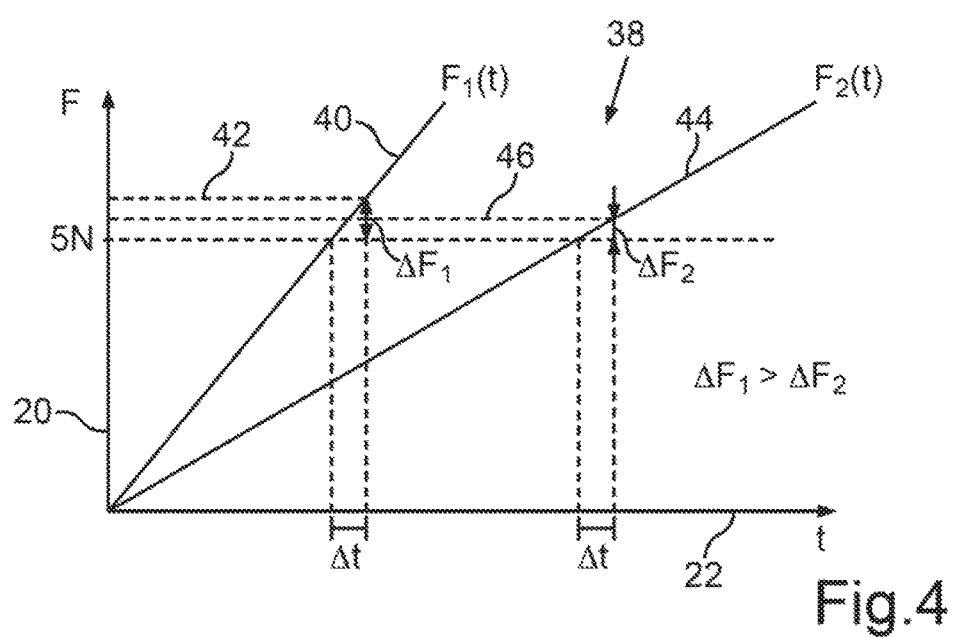
FIG. 4 is a graph of two different increases in force when operating the operator control device shown in FIG. 1 which result in different effective force thresholds with the same time delay.

By contrast, a second straight line 44 in the graph 38 in FIG. 4 illustrates a slower increase in force $F_2(t)$. Here, the gradient of the force F is determined by $\Delta F_2/\Delta t$. Accordingly, the haptic feedback is generated by the actuator 28 with the same time delay, that is to say after an equally long time period $\Delta t$, by which the generation of the haptic feedback is delayed with respect to the exceeding of the threshold value 26 of the force F. The haptic feedback is therefore generated by the actuator 28 as soon as the force F which the user applies reaches a value that is illustrated in FIG. 4 by a further auxiliary line 46. Therefore, when there is a smaller increase in force and the same delay time or time period $\Delta t$, the haptic feedback with respect to the force F applied by the user is perceived "earlier" by the user, that is when there is a lower force F.

In the present case, the evaluation unit 30 is designed to determine the gradient 32 of the force F and to reduce, that is to say downwardly adapt, the threshold value 26 according to the gradient determined. If the increase in force is very slow, the gradient 32 is therefore comparatively small, the force threshold, that is to say the threshold value 26 of the force F, can then remain virtually unchanged, and lie for example at approximately 5 N or lie just below 5 N, that is to say just below the initial value.

If, however, there is a rapid increase in force, that is to say for example a gradient 32 of 1 N per 10 milliseconds, the threshold value 26 can be reduced from the initial value 5 N to a changed value of 4 N with a delay time or time period $\Delta t$ of for example 10 milliseconds. Then, the exceeding of the threshold value of the force F of 4 N already brings about the actuation of the actuator 28, and, after the elapse of the time period $\Delta t$, the actuator 28 generates the haptic feedback. This has the effect that the user perceives the haptic feedback whenever the force F that is actually applied by the user is 5 N, and consequently lies above the reduced threshold value 26 of 4 N.

In the case of the operator control device 10 shown in FIG. 1, the triggering force felt by the user is therefore virtually independent of the actuating speed or the gradient 32 of the force F. Therefore, by taking into account the force gradient, a latency compensation, that is to say compensation for the delay time or time period Δt, can be achieved in the case of actoric operator control devices 10 or operator control elements.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in Superguide v. DIRECTV, 358 F3d 870, 69 USPQ2d 1865 (Fed. Cir. 2004).

The invention claimed is:

1. An operator control device for actuating functional units of an apparatus, comprising:
   a touch-sensitive surface;
   a force detector configured to detect a force applied by a user to at least one area of the touch-sensitive surface;
   an actuator configured to generate haptic feedback to the user when a threshold value is exceeded by the force; and
   a processor programmed to determine a time-related gradient of the force and to reduce the threshold value of the force, according to the gradient determined by the processor, to between 70% and 90% of an initial value of the force after a value of the gradient is greater than a predetermined value.

2. The operator control device as claimed in claim 1, wherein the processor is configured to take into account, when changing the threshold value of the force, a length of a time period between generation of the haptic feedback and a time when the force exceeds the threshold value.

3. The operator control device as claimed in claim 2, wherein the processor is configured to reduce the threshold value of the force as the length of the time period increases.

4. The operator control device as claimed in claim 3, wherein the operator control device detects the length of the time period.

5. The operator control device as claimed in claim 4, wherein the operator control device includes one of a touchpad and a touchscreen.

6. The operator control device as claimed in claim 2, wherein the operator control device detects the length of the time period.

7. The motor vehicle as claimed in claim 6, wherein the processor is configured to take into account, when changing the threshold value of the force, a length of a time period between a time when the force exceeds the threshold value and generation of the haptic feedback.

8. The motor vehicle as claimed in claim 6, wherein the operator control device includes one of a touchpad and a touchscreen.

9. The method as claimed in claim 8, wherein the changing reduces the threshold value of the force as the length of the time period increases.

10. The operator control device as claimed in claim 1, wherein the operator control device includes one of a touchpad and a touchscreen.

11. The motor vehicle as claimed in claim 10, wherein the processor is configured to reduce the threshold value of the force as the length of the time period increases.

12. The motor vehicle as claimed in claim 10, wherein the operator control device detects the length of the time period.

13. The method as claimed in claim 12,
    further comprising detecting a length of a time period between a time when the force exceeds the threshold value and generation of the haptic feedback, and
    wherein the changing of the threshold value takes into account the length of the time period between the time when the force exceeds the threshold value and generation of the haptic feedback.

14. A motor vehicle, comprising:
    a chassis; and
    at least one operator control device including
       a touch-sensitive surface;
       a force detector configured to detect a force applied by a user to at least one area of the touch-sensitive surface;
       an actuator configured to generate haptic feedback to the user when a threshold value is exceeded by the force; and
       a processor programmed to determine a time-related gradient of the force and to reduce the threshold value of the force, according to the gradient determined by the processor, to between 70% and 90% of an initial value of the force after a value of the gradient is greater than a predetermined value.

15. A method for actuating functional units of an apparatus, comprising:
    detecting a force applied by a user to at least one area of a touch-sensitive surface of an operator control device;
    generating haptic feedback to the user by an actuator after a threshold value is exceeded the force;
    actuating at least one of the functional units;
    determining a time-related gradient of the force by an evaluation unit of the operator control device; and
    changing the threshold value of the force, according to the time-related gradient, to approximately 70% to 90% of an initial value of the force after a value of the time-related gradient exceeds a predetermined value.

* * * * *

UNITED STATES PATENT AND TRADEMARK OFFICE
CERTIFICATE OF CORRECTION

Page 1 of 1

PATENT NO. : 10,331,213 B2
APPLICATION NO. : 15/575702
DATED : June 25, 2019
INVENTOR(S) : Ulrich Müller et al.

It is certified that error appears in the above-identified patent and that said Letters Patent is hereby corrected as shown below:

In the Claims

Column 8, Line 7:
In Claim 11, delete "claim 10," and insert --claim 7,--, therefor.

Column 8, Line 10:
In Claim 12, delete "claim 10," and insert --claim 7,--, therefor.

Signed and Sealed this
Fifteenth Day of October, 2019

Andrei Iancu
*Director of the United States Patent and Trademark Office*